(12) United States Patent
Liao et al.

(10) Patent No.: US 7,208,328 B2
(45) Date of Patent: Apr. 24, 2007

(54) METHOD AND SYSTEM FOR ANALYZING DEFECTS OF AN INTEGRATED CIRCUIT WAFER

(75) Inventors: Shu-Sing Liao, Taichung (CN); Szu-Tsun Ma, Hsinchu (CN)

(73) Assignee: Macronix International Co., Ltd., Hsinchu (TW)

( * ) Notice: Subject to any disclaimer, the term of this patent is extended or adjusted under 35 U.S.C. 154(b) by 491 days.

(21) Appl. No.: 10/801,954

(22) Filed: Mar. 16, 2004

(65) Prior Publication Data

US 2005/0210423 A1    Sep. 22, 2005

(51) Int. Cl.
*H01L 21/66* (2006.01)
*G01R 31/26* (2006.01)

(52) U.S. Cl. .................... 438/14; 257/E21.529; 702/83

(58) Field of Classification Search .................. 438/14; 257/E21.529; 702/33, 35, 117, 118, 119, 702/120, 83; 356/628, 625, 237.1
See application file for complete search history.

(56) References Cited

U.S. PATENT DOCUMENTS

| | | | |
|---|---|---|---|
| 5,544,256 | A | 8/1996 | Brecher et al. |
| 6,373,566 | B2 | 4/2002 | Zeimantz |
| 7,113,628 | B1 * | 9/2006 | Obara et al. ................ 382/149 |

2005/0158887 A1 *  7/2005  Simmons ..................... 438/14

OTHER PUBLICATIONS

Ingrid Peterson et al. "Effective Lithography Defect Monitoring" Lithography Inspection 2003, pp. 39-48.
Jeff Lin et al. "Increasing Learning Rate On Copper Processes" Yield Management Solutions, 1999, pp. 28-31.
KLA Tencor "Defect Source Identification Using ESA in Klarity ACE" Applications Note, Nov. 2001, pp. 1-7.

* cited by examiner

*Primary Examiner*—George Fourson
*Assistant Examiner*—Julio J. Maldonado
(74) *Attorney, Agent, or Firm*—Haynes Beffel & Wolfeld LLP

(57) ABSTRACT

Method and apparatus for efficiently analyzing visual defects of an integrated circuit wafer in the manufacturing process thereof by utilizing an asymmetric visual defect review methodology that can effectively extract high yield-killing defects out of numerous reported defects within the limited capacity and manpower available for review. Roughly described, the method comprises inspecting the semiconductor wafer, thereby obtaining the defect location and defect size, sampling the defects asymmetrically by determining asymmetrical defect review ratios, and thereby reviewing the defects asymmetrically. Also described is a method of asymmetrically sampling visual defects that can effectively extract out high yield-killing defects from a mass of defects by determining asymmetric defect review ratios, and a system for use in sampling visual defects asymmetrically.

20 Claims, 5 Drawing Sheets

METHOD AND SYSTEM FOR ANALYZING DEFECTS OF AN INTEGRATED CIRCUIT WAFER

BACKGROUND

1. Field of the Invention

The present invention relates in general to semiconductor wafer manufacturing. More particularly, the present invention relates to analyzing visual defects of a semiconductor wafer by utilizing an asymmetric review methodology in the manufacturing process of the semiconductor wafer.

2. Description of Related Art

Manufacturing processes for submicron integrated circuits (ICs) require strict process control for minimizing defects on integrated circuits. Defects are the major "killers" of devices formed during manufacturing, resulting in yield loss. Along with the trend of miniaturization of devices, the tolerance of defect size in IC chips becomes more stringent. Visual defect analysis has become an essential part of IC manufacturing processes. In-line inspection and review are important for determining whether wafers have become contaminated with particles due to a tool malfunction or process problem.

It is believed that the visual defects with larger defect size have greater "killing power" and will cause severe damage on the semiconductor circuit and deteriorate the performance of the semiconductor device. The design rules of devices have been rapidly shrinking. Accordingly, when inspecting semiconductor wafers in the manufacturing process, the sensitivity of the inspection must increase for capturing defects with defect sizes down to or even smaller than the design rule scale, which defects might cause a short or prevent the normal operation of the semiconductor device. Due to the greater inspection sensitivity, the reported defect counts are likely to increase. In addition, since small size defects are much more common than those of larger size, small size defects will likely greatly dominate the distribution. FIG. 1 is a histogram of defects that might be found on a typical wafer, broken down into 0.05 micron size ranges. As can be seen, the number of defects in the smallest size range is vastly larger than the number of defects in any other size range.

FIG. 2 is a flowchart illustrating a conventional process for analyzing defects on a semiconductor wafer. In step 202, an automatic machine vision tool is used to inspect some or all dice on the wafer for defects. The tool reports a location and size for each defect (referred to at this point as a "preliminary" defect) found. The preliminary defect information is transmitted to a database management system (DBMS), which sorts the preliminary defects into size ranges which typically are user-selectable to a limited extent, and reports a count of the number of preliminary defects found in each size range.

Most defects found visually, however, are not yield-killing. That is, they will not affect the operation of the device. But no good automated method has been found yet for reliably determining which preliminary defects are yield killers and which are not. Therefore most defect analysis processes include a subsequent "review" step for human review of the preliminary defects via such equipment as an optical microscope (OM) or a scanning electron microscope (SEM). The review step is expensive, however, both because the review station equipment is expensive and because the time required for human review of a defect is substantial. It is common practice, therefore, to select for review only a small percentage of the preliminary defects on a wafer. The selection can be made in the DBMS normally, by choosing one or more size ranges for review, or it can be made randomly by the review station, by setting a review ration (percentage) in an operation menu. Alternatively, an operator can manually select defects for review from an operation screen. Combinations of these selections methods also can be used.

Sophisticated statistical sampling methods may be used to improve the representativeness of this random selection. In step 204, therefore, a small percentage, specified by the operator, of the preliminary defects is selected for review. In step 206, the selected preliminary defects are reviewed in the review station and the results are statistically extrapolated to predict the yield-killing effect on each die or the entire wafer.

In the past, the database systems used to select defects randomly did not generally use defect size in determining its random sampling of defects for further analysis. The operator could specify that some percentage (e.g. 50%) of the defects are to be selected, and could even specify from which size ranges the defects should be selected. But the operator could not otherwise specify that the selection was to emphasize defects having a larger size. The random selection made by the DBMS system would give each defect in the specified size ranges an equal probability of selection regardless of its size. This sampling algorithm was therefore doubly-deficient: not only did it fail to emphasize the types of defects that were more likely to be yield killers, but because the number of defects of each size typically decreases rapidly as the size increases, a random sampling in which each defect is given equal likelihood of selection regardless of its size would in fact greatly emphasize smaller defects, which are less likely to be yield killers. Much time and expense has therefore in the past been used unproductively by obtaining redundant information from reviewing numerous small defects, while missing potentially important information that could be obtained by reviewing more larger-size defects.

SUMMARY OF THE INVENTION

Roughly described, one aspect of the present invention relates to providing a system and method for efficiently analyzing visual defects of a semiconductor wafer having integrated circuit semiconductor dice thereon in the manufacturing process by utilizing an asymmetric visual defect review methodology which emphasizes high yield-killing defects out of numerous reported defects within limited review capacity and manpower.

The present invention provides an effective defect review method. As a result, the present invention efficiently and effectively analyzes the visual defects of a semiconductor wafer in the manufacturing process.

In one aspect, still roughly described, the invention involves a method for analyzing defects of an integrated circuit wafer in the manufacture of the wafer, including steps of inspecting the wafer to automatically identify a plurality of defects, classifying defects from the plurality of defects into a plurality of groups including a first and a second group, the first group including only defects having a reported size that is at least as small as a first predetermined size and the second group including only defects having a reported size that is at least as large as the first predetermined size, and selecting for further review, defects from the second and first groups respectively in a ratio of $N_y:N_x$, where $N_y/N_x$ is larger than the ratio of the number of defects in the second group to the number of defects in the first group. Preferably $N_y$ is larger than $N_x$ (i.e. $N_y/N_x>1$), even where the number of defects in the first group exceeds the number of defects in the second group.

Another aspect of the invention, still roughly described, relates to a method of asymmetrically sampling visual defects that can effectively extract out high yield-killing defects from a mass of defects by determining asymmetric defect review ratios. The method comprises the steps of the following:

1. Sorting visual defects by reported defect size into a plurality of size ranges $S_0, S_1, S_n$, (in general $S_i$, i=0 . . . n), and a corresponding defect count $D_0, D_1, D_n$, (in general $D_j$), and $S_0$ having the smallest defect size and $S_n$ having the largest defect size among the plurality of size ranges;

2. Dividing the size ranges into two groups comprising a first size range group of $S_0$ and a second size range group of $S_1, S_2,$ and $S_n$, the first size range group having a characteristic number X and the second size range group having a characteristic number Y, wherein X and Y are evaluated by using the following equations:

$$X = \sum_{i=t}^{n} D_i$$

$$Y = \sum_{i=t}^{n} (i+1)D_i$$

The value t is an integer $0<=t<=n$, but is preferably 1 or m+1.

3. Selecting for further review a number $N_x$ of the defects from the first size range group and $N_y$ of the defects from the second size range group where $N_x/N_y=X/Y$.

DETAILED DESCRIPTION

One purpose of the invention is to provide a method of efficiently analyzing visual defects of a semiconductor wafer in the manufacturing process. In an embodiment described herein, a wafer that has been subjected to (or will be subjected to) an integrated circuit manufacturing process, is first inspected by automated equipment to identify "preliminary" defects on the wafer. Typically the preliminary inspection is a machine-vision inspection, and is intended to detect all defects above a preset threshold, that are (or will be) located on integrated circuit dice. The preliminary inspection system reports at least a size and a location for each defect identified. The defects are then classified into at least two groups: a first group containing only defects having a reported size that is at least as small as a predetermined size typically specified by the operator, and a second group containing only defects having a reported size that is at least as large as the predetermined size. In an embodiment in which the preliminary defects are pre-sorted into n+1 monotonically increasing size ranges $S_0, S_m, S_n$, where n>1 and $0<=m<n$, the classification step can be accomplished by classifying only defects from size ranges $S_0, S_m$ into the first group and only defects from size ranges $S_{m+1}, S_n$ into the second group. After the preliminary defects are classified into groups, the system randomly but asymmetrically selects defects from the two groups for further review. That is, it selects defects from the second and first groups, respectively, in a ratio of $N_y:N_x$, where $N_y/N_x$ is larger than the ratio of the number of defects in the second group to the number of defects in the first group. Preferably, $N_y:N_x$ is such that more defects are selected from the second group than the first, even if the predetermined size is chosen such that more defects are classified in the first group than the second.

The defects so-selected are then reviewed in a reviewing station, and the results are used for such purposes as keep/scrap decisions for individual dice or the entire wafer, and/or for process monitoring and improvement.

Figure 1:
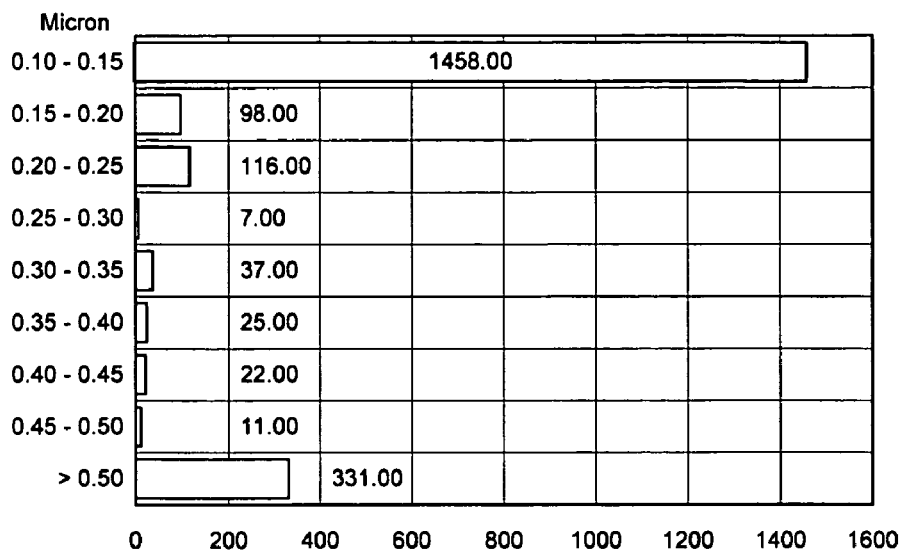
FIG. 1 is a histogram illustrating a typical defect size distribution reported by a visual inspection system.
Figure 2:
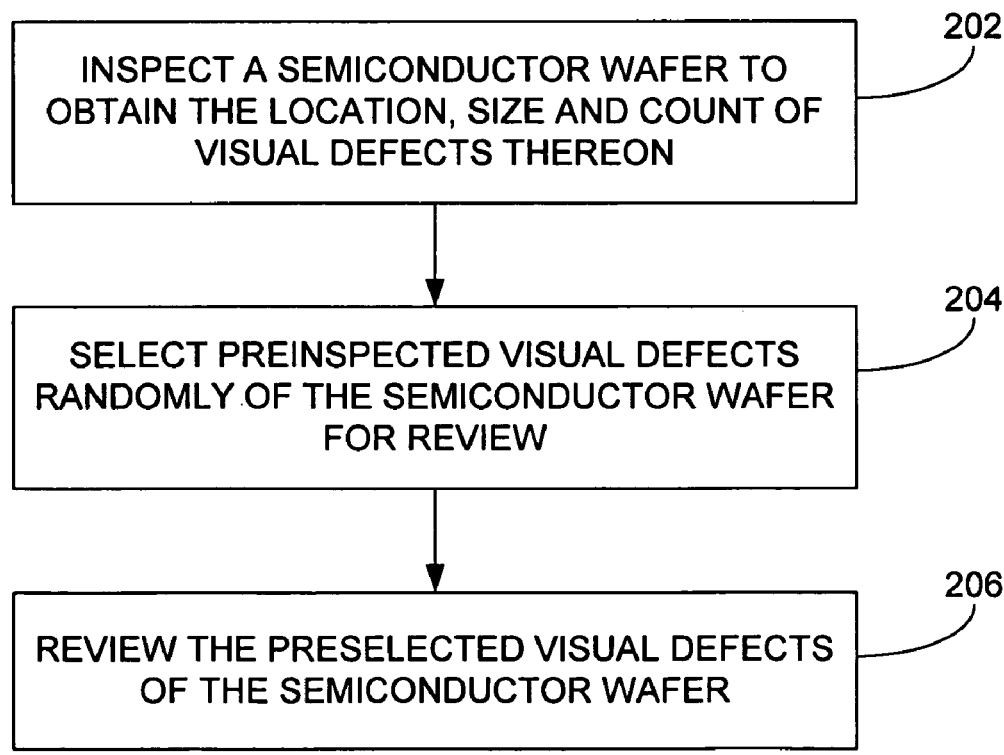
FIG. 2 is a flow chart illustrating a conventional process for analyzing visual defects of a semiconductor wafer in the manufacturing process thereof.
Figure 3:
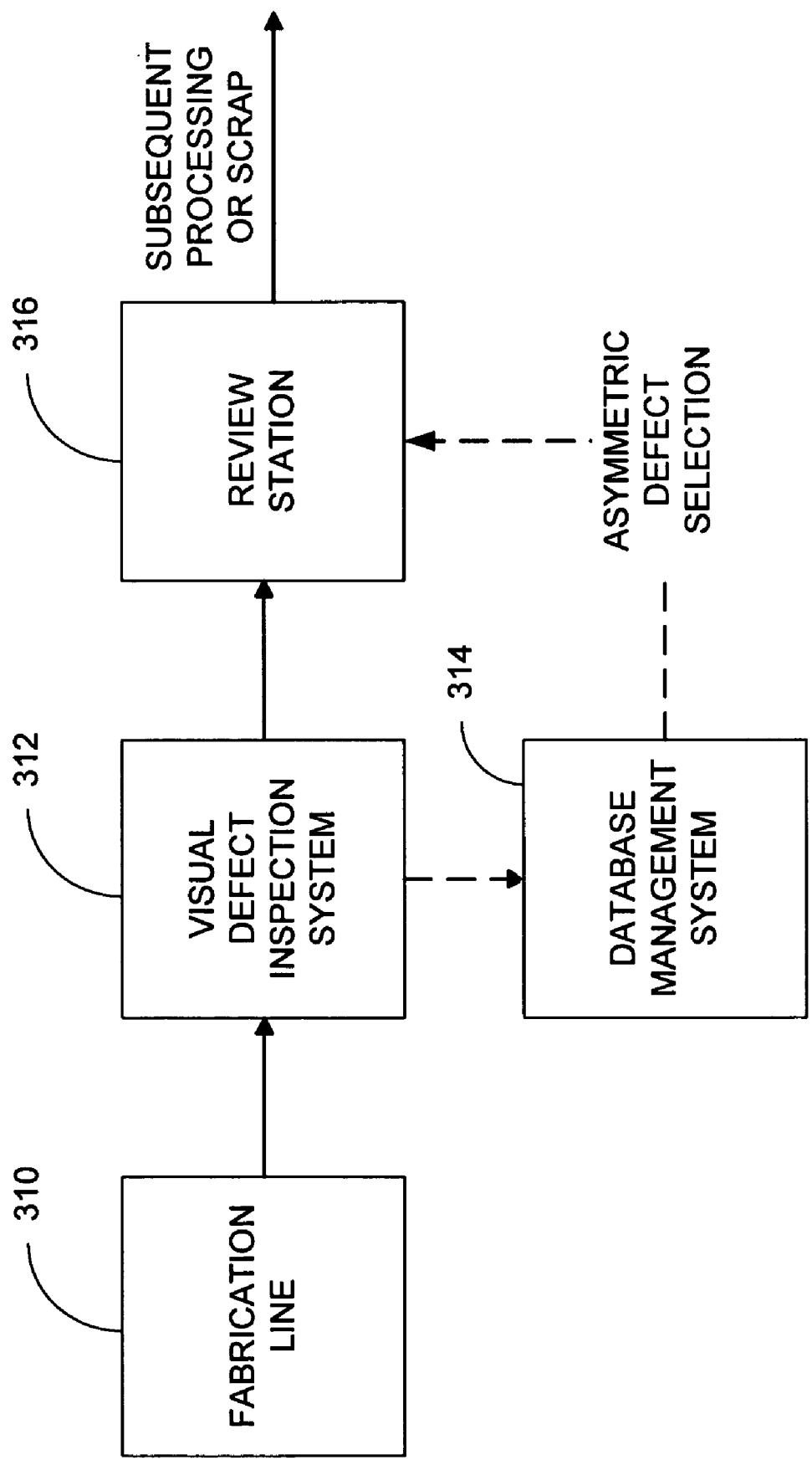
FIG. 3 is an overall block diagram of a system according to the invention.
Figure 4:
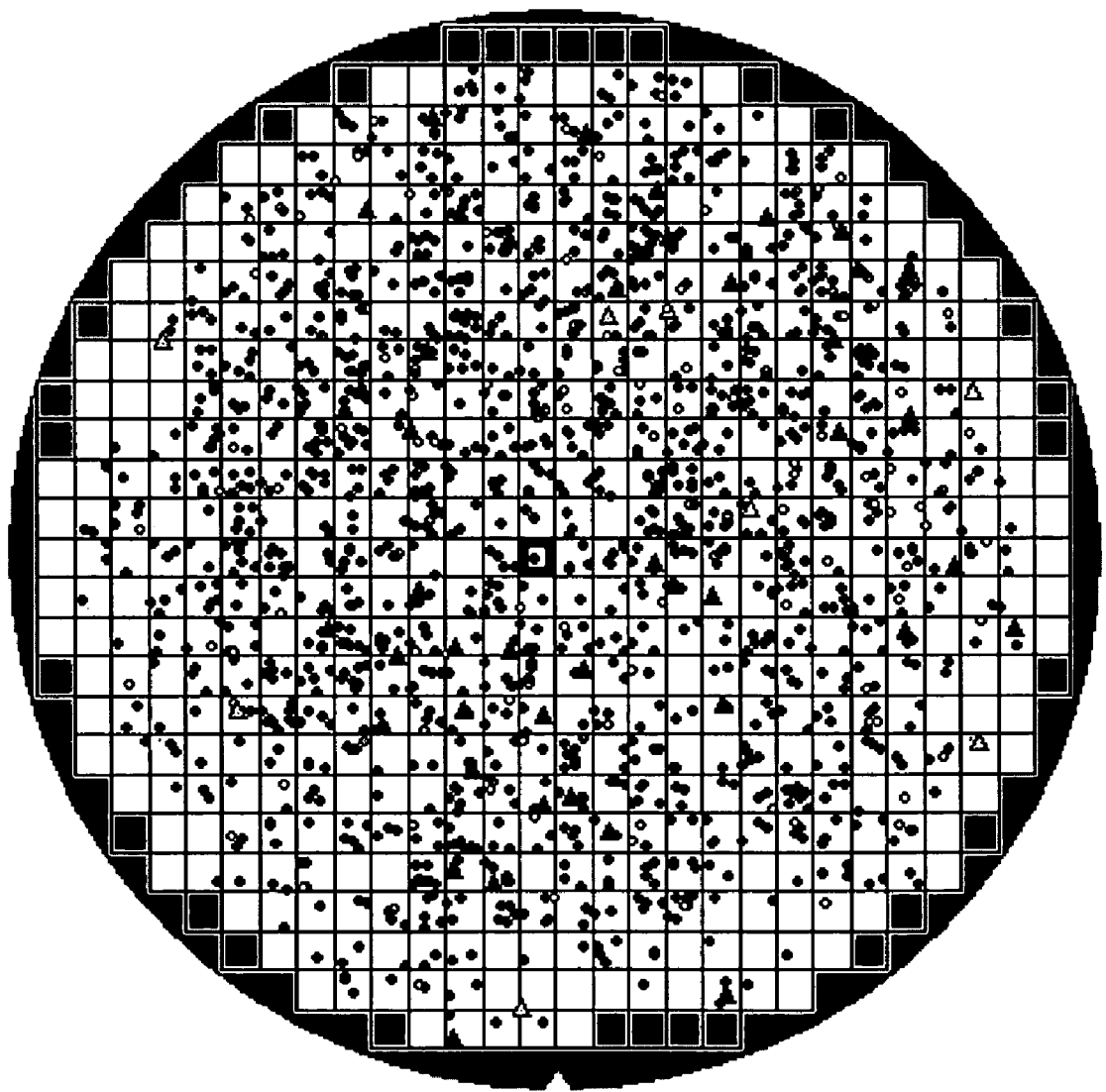
FIG. 4 is an example of a visual display showing reported defect locations on a semiconductor wafer.

FIG. 3 is an overall block diagram of a system according to the invention. Wafers are fabricated on a fabrication line 310, and then inspected automatically by a visual defect inspection tool 312. An example of a suitable tool 312 is the KLA-Tencor 21xx series visible brightfield system, available from KLA-Tencor, San Jose, Calif. The visual inspection tool 312 reports a size and location for each defect found, to a database management system (DBMS) 314. The visual inspection tool 312 may also be able to produce a visual display of defects identified on the wafer, such as display of FIG. 4. The DBMS 312 also sorts the defects identified for the current wafer into a plurality of user-specified size ranges such as those shown in the histogram of FIG. 1. (In another embodiment, the sorting might be performed by review station 316, described next.) The wafer is then passed on to a review station 316, which may be, for example, an optical microscope or a scanning electron microscope. The DBMS then selects specific ones of the defects identified by the visual defect inspection system 312, for further review in the review station 316, in accordance with an asymmetric defect selection method described herein. The review station 316 then shows each selected defect to a human operator, who evaluates the defect for its killing characteristics. In various embodiments, the functions of the DBMS 314 can be implemented in a stand-alone processor, or they can be integrated into the visual defect inspection system 312 or the review station 316. Additionally, the defect selection method can be carried out by the DBMS 314 or the review station 316 in various embodiments. Other arrangements will be apparent.

Figure 5:
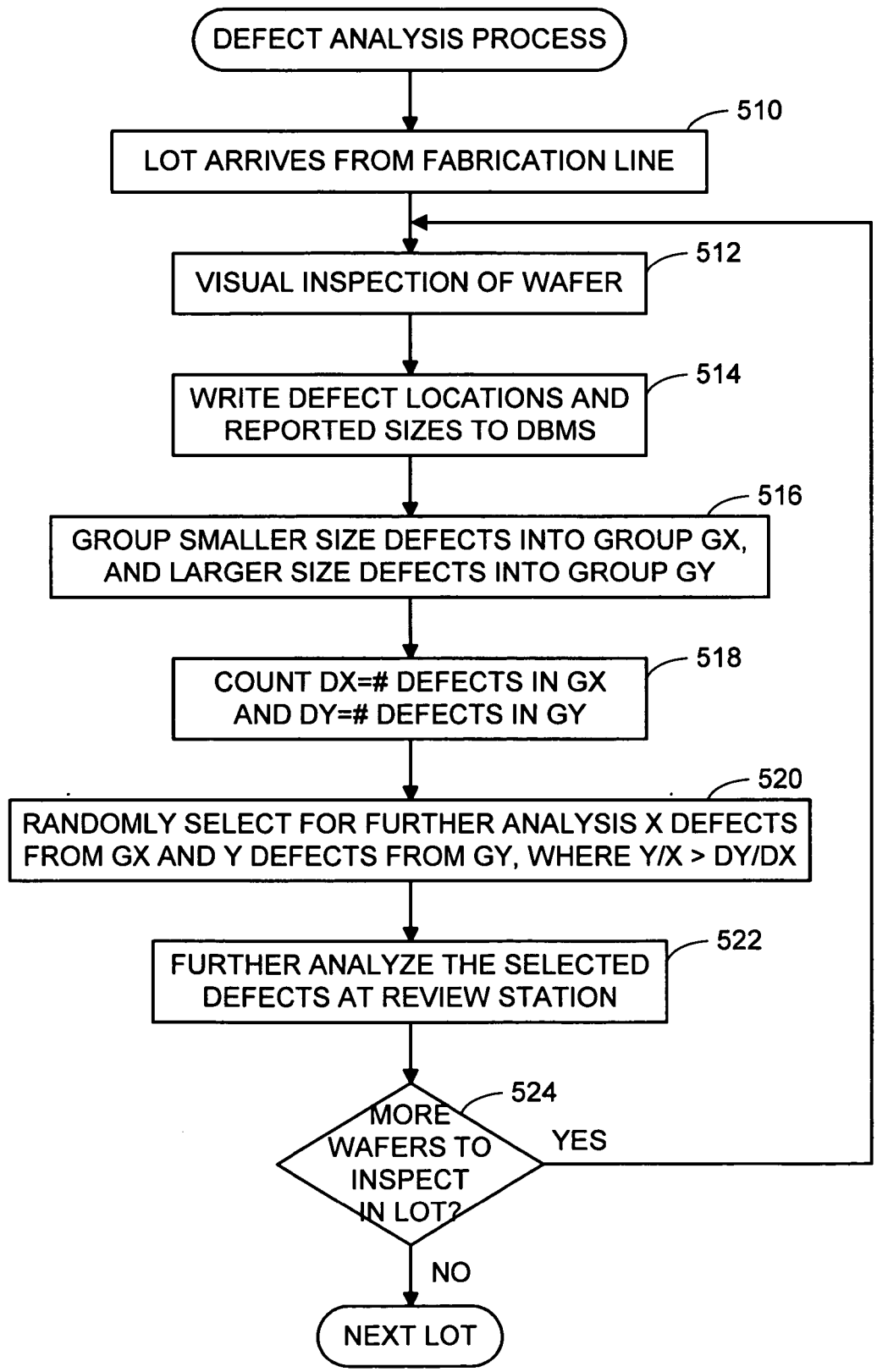
FIG. 5 is a flowchart illustrating process steps performed in an embodiment of the invention.

FIG. 5 is a flow chart illustrating steps performed in an embodiment of the invention. In step 510, a "lot" of wafers arrives at the visual defect inspection system 312 from the fabrication line 310. In a typical arrangement, wafers arriving from the fabrication line 310 arrive in bunches, rather than individually. Typically each of these bunches, referred to herein as a "lot" is housed in a single carrier as it is transported from machine to machine in the fabrication line 310. In one embodiment, all wafers from all arriving lots are inspected as described herein. In another embodiment, only selected lots are subjected to the inspection, and optionally only some wafers from each selected lot.

Once wafers are selected for inspection, in one embodiment of the invention, all of the selected wafers are inspected by the visual defect inspection system 312 before any of them are passed on to the review station 316. In another embodiment, each of the selected wafers is inspected by the visual defect inspection system 312 and passed on to the review station 316 before the next wafer is inspected by the visual defect inspection system 312. It is the latter of these two sequences which is followed in the embodiment of FIG. 5. Many other satisfactory sequences will be apparent to the reader. Also, it will be appreciated that in other embodiments, two or all three of the units 312, 314, and 316 can be combined into a single physical unit.

In step 512, the visual defect inspection system 312 automatically inspects the wafer to identify defects on the individual dice of the wafer. The inspection performed by the visual defect inspection system 312 is intended to identify all defects on the wafer that are located on dice, down to the limit of sensitivity of the system 312 or some other pre-set limit. However, in other embodiments, this first defect detection mechanism might identify fewer than all the defects within its sensitivity.

Note that whereas the preliminary automatic detection system 312 in the embodiment of FIG. 3 uses machine vision to detect defects, it will be understood that other detection mechanisms may be used in other embodiments (e-beam source mechanisms, for example), in addition to or instead of a machine vision system. For this reason, the defects identified by the defect inspection system 312 are sometimes referred to herein as "preliminary" defects rather than more specifically "visual" defects.

In step 514, the defect inspection system 312 writes into the DBMS 314 a defect location and a defect size for each defect it identified in step 512. In an embodiment, it also sorts the identified defects into size ranges, and writes to the DBMS 314 both an indication of the size range assigned to each defect, and also a count of the total number of defects identified in each size range.

The "size" that the defect inspection system 312 reports to the DBMS 314 is not necessarily an absolute physical size since it depends upon such factors as the method used by the visual inspection system to detect defects, the pixel size of the visual inspection system, the noise filters and magnitude thresholds applied by the system, the parameters by which the system determines whether to merge several visual marks into a single defect, among other things. In addition, if the defect is identified as occupying a specific area on a grid, different systems may report the size in dependence upon either the total pixel area occupied or the number of pixels covered in one dimension or another. Many other factors might also play a role in the size that the system reports for individual defects. Moreover, on many visual inspection systems, many of the parameters that affect the reported sizes are adjustable by the operator. For these reasons, the size reported by the defect inspection system 312 to the DBMS is sometimes referred to herein as a "reported" size rather than an absolute size.

It will be appreciated that the non-absolute nature of the reported defect sizes does not significantly degrade the analysis, since reported defect sizes are still informative relative to other reported defect sizes on a wafer or on other wafers emerging from a fabrication line. In addition, if the relationship between reported and actual defect sizes is known, the difference can be compensated either on the defect inspection system 312 before sizes are reported, or in the DBMS 314 as a separate step, or by appropriate modification of the size thresholds used for sorting and grouping defects.

In step 516, the defects identified in step 512 are classified into two groups according to their reported size. In particular, all defects having a reported size less than some predetermined size, for example 0.15 micron, are classified in the first group $G_X$ and all defects having a reported size greater than the predetermined size are classified in the second group $G_Y$. Depending on the embodiment, defects having a reported size exactly equal to 0.15 micron might be classified in either the first or the second group.

In step 518, the number of defects classified in each group are counted. Let $D_x$ be the number of defects in group $G_X$, and $D_y$ be the number of defects in group $G_Y$. In step 520, the system selects for further analysis at the review station 316, $N_x$ defects from group $G_X$ and $N_y$ defects from group $G_Y$. But in order to emphasize larger size defects asymmetrically relative to smaller size defects, $N_x$ and $N_y$ are chosen such that $N_y/N_x > D_y/D_x$. That is, the ratio of the number of defects chosen from group $G_Y$ to the number chosen from $G_X$ is greater than the ratio of defects in $G_Y$ to the number of defects in $G_X$. The selection of individual defects from the groups for further analysis preferably is performed using statistical techniques that increase the likelihood that the sample selected is representative of other defects in the group. The selection method may also include an element of randomness (which, as the term is used herein, includes pseudorandomness). As used herein, the selection is a "random" selection if it includes at least some element of randomness.

In step 522, the defects selected in step 520 are further analyzed in the review station 316.

In step 524, if the current lot contains more wafers selected for inspection, then the method returns to step 512 for preliminary inspection of the next wafer in the lot. If not, then the method proceeds to the next selected lot (if any).

Figure 6:
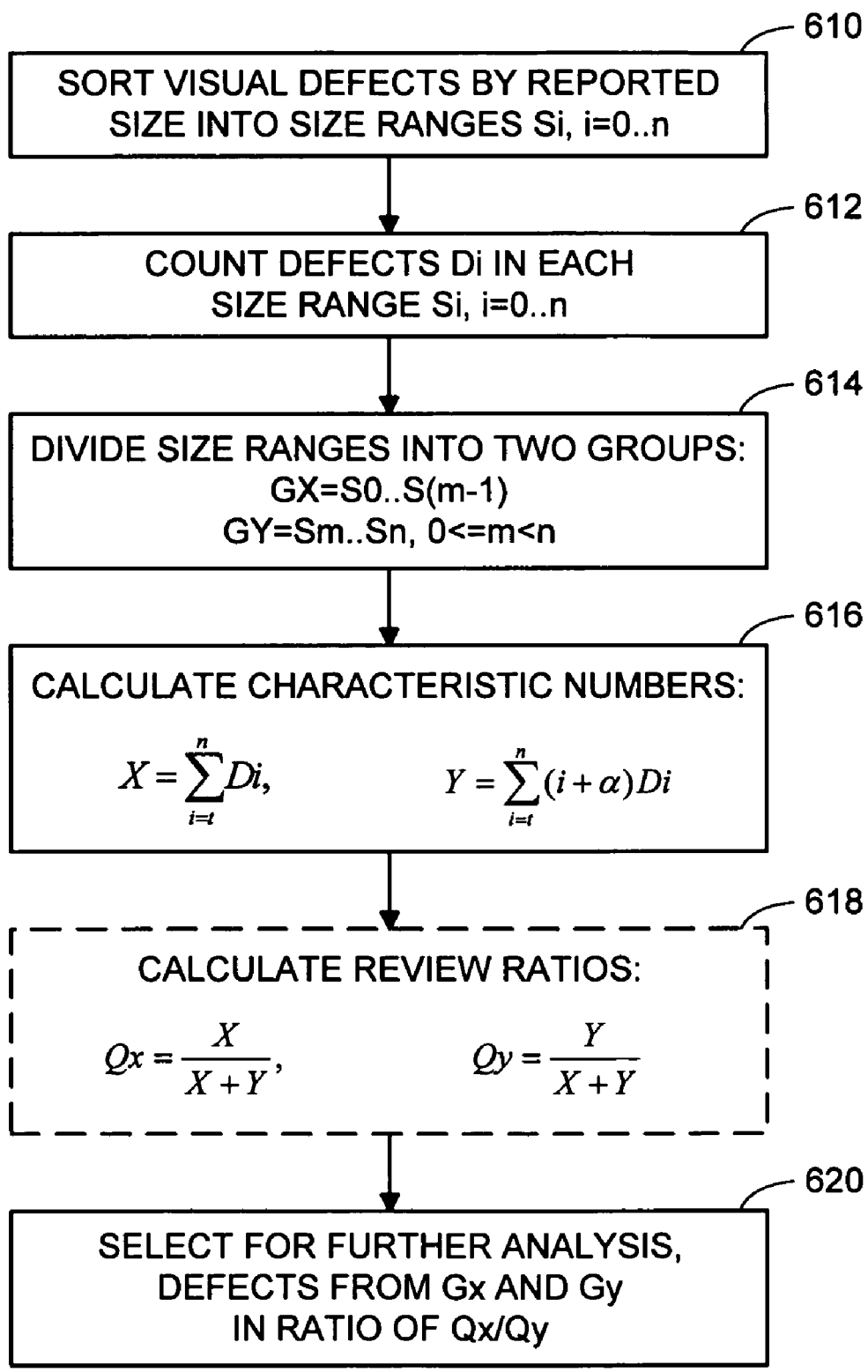
FIG. 6 is a flowchart illustrating additional details of how the steps might be accomplished in a particular embodiment.

The steps 514, 516, 518 and 520 in FIG. 5 can be performed by a separate unit, or it can be integrated with a data management system which manages the data of the preliminary defects as received from the defect inspection system 312, or it can be integrated with the defect review station 316, among other places. FIG. 6 is a flowchart illustrating additional details of how the steps might be accomplished in a particular embodiment.

Referring to FIG. 6, in step 610, the defects identified by visual defect inspection system 312 are sorted into n+1 monotonically increasing size ranges $S_i$, i=0 ... n. That is, each size range $S_i$ contains all identified defects having a reported size between lower and upper size thresholds for size range $S_i$, and the lower size thresholds increase monotonically with i. The upper size thresholds also increase monotonically with i. In step 612, the defects in each size range are counted. Let $D_i$ be the number of defects in each size range $S_i$, i=0 ... n. (Actually, it will be seen that in some embodiments, not all counts $D_i$ are used during subsequent calculations. In such embodiments, it is not necessary to count the defects in size ranges for which the counts are not used.)

In step 614, the defect size ranges are divided into two groups, $G_x$ and $G_y$, with $G_x$ containing the defects in size ranges $S_0 \ldots S_m$ and $G_y$ containing the defects in size ranges $S_{m+1} \ldots S_n$. The number m is a predetermined integer between 0 (inclusive) and n (exclusive). The division of the size ranges into two groups effectively accomplishes the classification, in step 516 (FIG. 5), of defects into the two groups $G_x$ and $G_y$.

In step 616, characteristic numbers X and Y are calculated for the two groups $G_x$ and $G_y$, respectively, according to the equations:

$$X = \sum_{i=t}^{n} D_i$$

$$Y = \sum_{i=t}^{n} (i+\alpha)D_i,$$

for some predetermined non-negative integer $\alpha$, and for some integer t, 0<=t<=n.

In step 618, review ratios $Q_x$ and $Q_y$ are calculated for the two groups $G_x$ and $G_y$, respectively, according to the equations:

$$Qx = \frac{X}{X+Y},$$

$$Qy = \frac{Y}{X+Y}.$$

In step 620, defects from each of the groups $G_x$ and $G_y$, respectively, are selected for further analysis in a ratio of $Q_x/Q_y$. It will be appreciated that since $X/Y=Q_x/Q_y$, step 618 may be omitted and the defects can be selected in a ratio of X/Y.

In an embodiment, m=0, t=1 and $\alpha$=1. In this embodiment, therefore:

$$X = \sum_{i=1}^{n} D_i, Y = \sum_{i=1}^{n} (i+1)D_i.$$

Since m=0 in this embodiment, group $G_x$ contains only size range $S_0$ and group $G_y$ contains all other sort ranges $S_1 \ldots S_n$. Note that $D_0$ is never used in this embodiment, so the number of defects in size range $S_0$ need not be counted.

Many other formulas can be used for calculating the review ratios. In general, the formulas are chosen such that $N_y/N_x$ is greater than the ratio of the number of defects in $G_y$ to the number of defects in $G_x$. Preferably $N_y$ is also greater than $N_x$ (i.e. more defects are selected from $G_y$ than from $G_x$), even though the number of defects in $G_x$ is typically much greater than the number of defects in $G_y$.

Table I summarizes defect counts and groupings for a typical wafer. In this illustration the defects have been sorted into 142 size ranges $S_0 \ldots S_{141}$, each i'th size range including defects having a reported size between (i+1)/10 and (i+2)/10 microns. Size ranges not shown in the table have zero defect count ($D_i$=0). In this illustration, m=0 so that the first group $G_x$ contains only those defects from size range $S_0$ and the second group $G_y$ contains all other defects.

TABLE I

| Size | First | Second | | | | | | | | | | |
|---|---|---|---|---|---|---|---|---|---|---|---|---|
| Range | S0 | S1 | S2 | S3 | S4 | S6 | S10 | S14 | S24 | S25 | S39 | S43 |
| $S_i$ (um, size) | 0.1–0.2 | 0.2–0.3 | 0.3–0.4 | 0.4–0.5 | 0.5–0.6 | 0.7–0.8 | 1.1–1.2 | 1.5–1.6 | 2.5–2.6 | 2.6–2.7 | 4.0–4.1 | 4.4–4.5 |
| i | 0 | 1 | 2 | 3 | 4 | 6 | 10 | 14 | 24 | 25 | 39 | 43 |
| $D_i$ (each, defect) | 1122 | 262 | 21 | 21 | 2 | 1 | 1 | 1 | 1 | 1 | 1 | 1 |

| Size | Second | | | | | | | | | | | |
|---|---|---|---|---|---|---|---|---|---|---|---|---|
| Range | S44 | S53 | S72 | S85 | S93 | S108 | S111 | S112 | S113 | S114 | S118 | S141 |
| $S_i$ (um, size) | 4.5–4.6 | 5.4–5.5 | 7.3–7.4 | 8.6–8.7 | 9.4–9.5 | 10.9–11.0 | 11.2–11.3 | 11.3–11.4 | 11.4–11.5 | 11.5–11.6 | 11.9–12.0 | 14.2–14.3 |
| i | 44 | 53 | 72 | 85 | 93 | 108 | 111 | 112 | 113 | 114 | 118 | 141 |
| $D_i$ (each, defect) | 1 | 1 | 1 | 1 | 1 | 1 | 1 | 2 | 1 | 1 | 1 | 1 |

It can be seen that the number of defects in group $G_x$ is 1122, whereas the number of defects in group $G_y$ is 326. Conventional random selection methods would therefore select for further analysis defects from groups $G_x$ and $G_y$, respectively, in a ratio of 1122:326, which is approximately equal to 3.4:1.

But using the following equations for characteristic numbers X and Y:

$$X = \sum_{i=m+1}^{n} D_i, Y = \sum_{i=m+1}^{n} (i+\alpha)D_i,$$

we can calculate X=326 and Y=2138.

In step 618, therefore, we calculate $Q_x$=0.13 and $Q_y$=0.87. Accordingly, about 13% of the defects selected in step 620 for review in review station 316 will be selected from the first group $G_x$, and about 87% will be selected from the second group $G_y$. Said another way, defects will be selected in step 620 from groups $G_y$ and $G_x$ respectively, in a ratio of $N_y:N_x$=2138:326, which is approximately 6.6:1. Many more defects will be selected from the group having defects of larger reported size, therefore, than the number that will be selected from the group having defects of smaller reported size, even though the number of smaller size defects exceeds the number of larger size defects by a ratio of about 3.4:1.

As used herein, a given event or value is "responsive" to a predecessor event or value if the predecessor event or value influenced the given event or value. If there is an intervening processing element, step or time period, the given event or value can still be "responsive" to the predecessor event or value. If the intervening processing element or step combines more than one event or value, the output of the processing element or step is considered "responsive" to each of the event or value inputs. If the given event or value is the same as the predecessor event or value, this is merely a degenerate case in which the given event or value is still considered to be "responsive" to the predecessor event or value. "Dependency" of a given event or value upon another event or value is defined similarly.

While this invention has been described with reference to what is presently considered to be the most practical and preferred embodiments, it is to be understood that the invention is not limited to the disclosed embodiments. Various substitutions and modifications have been suggested in the foregoing description, and other will occur to those of ordinary skill in the art. For example, the usefulness of the invention is not limited to semiconductor wafers. Other kinds of integrated circuit wafers that suffer from yield-killing defects can also benefit from the invention. As another example, whereas the embodiments described above classify defects on the basis of reported size into two groups $G_x$ and $G_y$, and then selects defects for further review in a ratio of $N_y/N_x>D_y/D_x$, another embodiment could classify defects into three groups $G_x$, $G_y$ and $G_z$, and select defects for further review in a ratio of $N_z:N_y:N_x$, where $N_z/N_y>D_z/D_y$, $D_x$ or $N_z/N_x>D_y/D_x$ or both. Classifications into more than three groups are also possible. The invention is intended to cover all such substitutions and modifications included within the spirit and scope of the appended claims.

What is claimed is:

1. A method for analyzing defects of an integrated circuit wafer in the manufacture of the wafer, comprising:
   inspecting the wafer to automatically identify a plurality of defects;
   classifying defects from the plurality of defects into a plurality of groups including a first and a second group, the first group including only defects having a reported size that is at least as small as a first predetermined size and the second group including only defects having a reported size that is at least as large as the first predetermined size;
   selecting for further review, defects from the second and first groups respectively in a ratio of $N_y:N_x$, where $N_y/N_x$ is larger than the ratio of the number of defects in the second group to the number of defects in the first group.

2. A method according to claim 1, wherein in the step of classifying, the second group includes only defects having a reported size that is at least as small as a second predetermined size larger than the first predetermined size,
   wherein the plurality of groups further includes a third group including only defects having a reported size that is at least as large as the second predetermined size,
   further comprising the step of selecting for further review, defects from the third group in a ratio of $N_z:N_y$, where $N_z/N_y$ is larger than the ratio of the number of defects in the third group to the number of defects in the second group.

3. A method according to claim 1, wherein in the step of classifying, the second group includes only defects having a reported size that is at least as small as a second predetermined size larger than the first predetermined size,
   wherein the plurality of groups further includes a third group including only defects having a reported size that is at least as large as the second predetermined size,
   further comprising the step of selecting for further review, defects from the third group in a ratio of $N_z:N_x$, where $N_z/N_x$ is larger than the ratio of the number of defects in the third group to the number of defects in the first group.

4. A method according to claim 1, wherein the second group includes only defects having a reported size that is larger than the first predetermined size.

5. A method according to claim 1, wherein the first group includes only defects having a reported size that is smaller than the first predetermined size.

6. A method according to claim 1, wherein the step of classifying comprises the steps of:
   pre-sorting the plurality of defects identified in the step of inspecting, into n+1 monotonically increasing size ranges $S_0, \ldots, S_m, \ldots, S_n$, where n>1 and 0<=m<n; and
   classifying only defects from size ranges $S_0, \ldots, S_m$ into the first group and classifying only defects from size ranges $S_m+1, \ldots, S_n$ into the second group.

7. A method according to claim 6, wherein $$N_y/N_x \geq \frac{\sum_{i=m}^{n}(m+\alpha)D_i}{\sum_{i=m}^{n}D_i},$$

where t is an integer between 0 and n inclusive, $\alpha$ is a non-negative integer, and $D_i$ is the number of defects in size range $S_i$, i=0, ..., n.

8. A method according to claim 7, wherein t=1.

9. A method according to claim 7, wherein t=m+1.

10. A method according to claim 6, wherein $N_x$=X/(X+Y) and $N_y$=Y/(X+Y), where $$X = \sum_{i=t}^{n} D_i$$

$$Y = \sum_{i=t}^{n} (i+\alpha)D_i,$$

where t is an integer between 0 and n inclusive, $\alpha$ is an integer, and $D_i$ is the number of defects in size range $S_i$, i=0, ..., n.

11. A method according to claim 6, wherein $$N_y/N_x \geq \frac{\sum_{i=m+1}^{n}(i+\alpha)D_i}{\sum_{i=m+1}^{n}D_i},$$

where $\alpha$ is a non-negative integer, and $D_i$ is the number of defects in size range $S_i$, i=0, ..., n.

12. A method according to claim 11, wherein $\alpha$=1.

13. A method according to claim 1, wherein $N_y$ is larger than $N_x$.

14. A method according to claim 1, further comprising the step of repeating the steps of inspecting, classifying and selecting for each of a plurality of wafers in a lot.

15. A method according to claim 14, wherein the step of inspecting is performed for all wafers in the plurality of wafers before the step of classifying begins for any wafer in the plurality of wafers.

16. A method according to claim 1, further comprising the step of reviewing the defects selected in the step of selecting for further review.

17. A method according to claim 16, wherein the step of reviewing, for each particular defect, comprises the step of observing the given defect via a member of the group consisting of a scanning electron microscope and an optical microscope.

18. A method according to claim 16, wherein the step of reviewing, for each particular defect, comprises the step of analyzing the given defect manually.

19. A method according to claim 16, wherein the step of reviewing, for each particular defect, comprises the step of analyzing the given defect via an automatic defect review system.

20. A method according to claim 16, further comprising the step of scrapping at least a die of the wafer in response to the step of reviewing.

* * * * *